United States Patent
Wu et al.

(10) Patent No.: US 10,111,329 B2
(45) Date of Patent: Oct. 23, 2018

(54) FLEXIBLE FLAT CABLE STRUCTURE CAPABLE OF IMPROVING CROSSTALK INTERFERENCE

(71) Applicant: PORTWELL INC., New Taipei (TW)

(72) Inventors: Ruey Beei Wu, New Taipei (TW); Shih Ya Huang, New Taipei (TW); Chia Tsung Liu, New Taipei (TW); Shih Hsing Ku, New Taipei (TW)

(73) Assignee: PORTWELL INC., New Taipei (TW)

( * ) Notice: Subject to any disclaimer, the term of this patent is extended or adjusted under 35 U.S.C. 154(b) by 0 days.

(21) Appl. No.: 15/587,912

(22) Filed: May 5, 2017

(65) Prior Publication Data

US 2017/0243677 A1     Aug. 24, 2017

Related U.S. Application Data

(63) Continuation-in-part of application No. 14/974,720, filed on Dec. 18, 2015, now abandoned.

(51) Int. Cl.
*H01B 7/08* (2006.01)
*H05K 1/03* (2006.01)
*H05K 1/02* (2006.01)

(52) U.S. Cl.
CPC ......... *H05K 1/0373* (2013.01); *H05K 1/0216* (2013.01)

(58) Field of Classification Search
CPC ........................................ H01B 7/08
USPC ........................................ 174/117 F, 117 FF
See application file for complete search history.

(56) References Cited

U.S. PATENT DOCUMENTS

| 4,382,236 A * | 5/1983 | Suzuki | H01B 7/0838 156/52 |
|---|---|---|---|
| RE31,477 E * | 12/1983 | Marshall | H01B 11/00 174/115 |
| 5,817,973 A | 10/1998 | Elco | |
| 6,621,384 B1 | 9/2003 | Handforth | |
| 6,730,622 B2 | 5/2004 | Curro | |
| 6,737,589 B2 * | 5/2004 | Adachi | H05K 1/028 174/254 |
| 2003/0019659 A1 | 1/2003 | Yamanobe | |
| 2006/0030171 A1 | 2/2006 | Hung | |
| 2006/0169481 A1 | 8/2006 | Stotz | |

(Continued)

*Primary Examiner* — Chau N Nguyen
(74) *Attorney, Agent, or Firm* — Muncy, Geissler, Olds & Lowe, P.C.

(57) ABSTRACT

A flexible flat cable structure capable of improving crosstalk interference includes plural telecommunication signal conductors separated from one another and provided for transmitting differential signals, two support members installed on two lateral sides of the telecommunication signal conductor respectively, at least one filled material disposed between the telecommunication signal conductors. The ratio of the equivalent dielectric constant of the filled material to the equivalent dielectric constant of the support members falls within a range of 0.39~0.27, and the ratio of the thickness of the filled material to the thickness of the support members falls within a range of 1.49~1.37. Therefore, the flexible flat cable structure achieves the effects of reducing the time delay of the signal transmission of the flexible flat cable (FFC), suppressing the ringing noise of resonance, and improving the eye height of amplitude measurement, so as to suppress crosstalk interference and improve signal transmission quality effectively.

6 Claims, 7 Drawing Sheets

(56) References Cited

U.S. PATENT DOCUMENTS

2008/0185167 A1  8/2008  Lee
2010/0046355 A1  2/2010  Nuzman

* cited by examiner

FLEXIBLE FLAT CABLE STRUCTURE CAPABLE OF IMPROVING CROSSTALK INTERFERENCE

CROSS REFERENCE TO RELATED APPLICATIONS

This application is a Continuation-in-Part of co-pending application Ser. No. 14/974,720, filed on Dec. 18, 2015, for which priority is claimed under 35 U.S.C. § 120; the entire contents of all of which are hereby incorporated by reference.

TECHNICAL FIELD

The technical field relates to a flexible flat cable structure, and more particularly to a flexible flat cable structure capable of improving crosstalk interference, and the flexible flat cable structure eliminates crosstalk noise and resonance interference effectively by adjusting the ratio of equivalent dielectric constant to thickness of a filled material and a support plate of the flexible flat cable (FFC).

BACKGROUND

As electronic and computer devices have increasingly more powerful functions, a flexible flat cable (FFC/Flex Flat Cable) is provided for the connection and transmission of related telecommunication signals in order to fit system requirements of high density and data speed. In general, the flexible flat cable (FFC) is a novel data cable made of polyethylene terephthalate (PET) or any other insulating material and manufactured by laminating a very thin thinned flat copper wire in an automated production line, and the flexible flat cable has the features of high softness and bendability, small thickness and volume, simple connection, convenient removal, and excellent electromagnetic shielding, so that the flexible flat cable (FFC) is very suitable to be used as a data transmission cable between movable parts and a main boards, between boards, and/or in a small electric appliance, and a connector installed on a printed circuit board (PCB) is provided for connecting the PCB, so that the flexible flat cable can be used extensively in the connection between a printer head and a main board, and the connection of a signal transmission board of a plotter, a scanner, a copying machine, a stereo, a fax machine, a variety of video systems, automotive equipments, etc.

In an application of the flexible flat cable (FFC), an aluminum foil is stuck onto a surface of a cable and a conductive silver ink is applied to a metal conductive wire, but such shielding assembly is intended for overcoming the electromagnetic interference (EMI) issue, but is unable to overcome the crosstalk interference of the flexible flat cable (FFC) caused by the imperfect resonance effect of the ground line. Since the conductive wires of the flexible flat cable (FFC) have a small pitch, so that the crosstalk interference is even more obvious, and the resonance effect caused by the crosstalk interference reduces the signal quality. When the flexible flat cable is applied for connecting high-speed signals, a distortion of signal transmission often occurs, and the eye pattern, eye height, and eye width of the displayed digital telecommunication signals fail to comply with industrial standards. Obviously, the conventional flexible flat cable requires improvements. Therefore, it is an important subject for related manufacturers and designers to overcome the drawbacks of the conventional flexible flat cable (FFC) that is unable to effectively reduce crosstalk interference and signal transmission distortion.

Therefore, the discloser of this disclosure based on years of experiments in the related industry to conduct researches and experiments, and finally developed a flexible flat cable structure capable of improving crosstalk interference, eliminating difference of time delay, suppressing crosstalk interference, and improving signal transmission quality effectively.

SUMMARY

In view of the drawbacks of the prior art, the discloser of this disclosure based on years of experience in the related industry to conduct extensive researches and experiments, and finally provided a feasible solution to overcome the drawbacks of the prior art.

Therefore, it is a primary objective of this disclosure to provide a flexible flat cable structure capable of improving crosstalk interference and eliminating the time delay of the signal transmission through the flexible flat cable (FFC) to suppress the ring noise of resonance and enhance the eye height of amplitude measurement, so as to achieve the effects of suppressing crosstalk interference and improving signal transmission quality.

Another objective of this disclosure is to provide a flexible flat cable structure capable of improving crosstalk interference, wherein the ratio of the equivalent dielectric constant of the filled material to the equivalent constant of the support plate of the flexible flat cable (FFC) and the ratio of the thicknesses are adjusted to eliminate the crosstalk issue caused by resonance, so as to improve the signal transmission quality of the flexible flat cable significantly.

To achieve the aforementioned and other objectives, this disclosure provides a flexible flat cable structure capable of improving crosstalk interference, and the structure comprises: a plurality of telecommunication signal conductors, separately arranged with respect to each other and provided for transmitting a differential signal; two support members, installed on two lateral sides of the telecommunication signal conductor respectively; and at least one filled material, disposed between the plurality of telecommunication signal conductors. In the aforementioned structure, the ratio of the equivalent dielectric constant of the filled material to the equivalent dielectric constant of the support members falls within a range of 0.39~0.27, and the ratio of the thickness of the filled material to the thickness of the support members falls within a range of 1.49~1.37. The aforementioned structure is capable of eliminating crosstalk interference effectively.

In the aforementioned structure, the ratio of the equivalent dielectric constant of the filled material to the equivalent dielectric constant of the support member falls within a range of 0.36~0.30.

In the aforementioned structure, the ratio of the equivalent dielectric constant of the filled material to the equivalent dielectric constant of the support member falls within a range of 0.34~0.33.

In the aforementioned structure, the ratio of the thickness of the filled material to the thickness of the support member falls within a range of 1.46~1.40.

In the aforementioned structure, the ratio of the thickness of the filled material to the thickness of the support member falls within a range of 1.49~1.42.

In the aforementioned structure, ratio of the equivalent dielectric constant of the filled material to the of the support member falls within a range of 0.340.33, and the ratio of the thickness to the filled material to the thickness of the support members falls within a range of 1.43~1.42.

In the aforementioned structure, the support member is made of polyester.

This disclosure will become clearer in light of the following detailed description of an illustrative embodiment of this invention described in connection with the drawings.

DESCRIPTION OF THE PREFERRED EMBODIMENTS

Figure 1A:
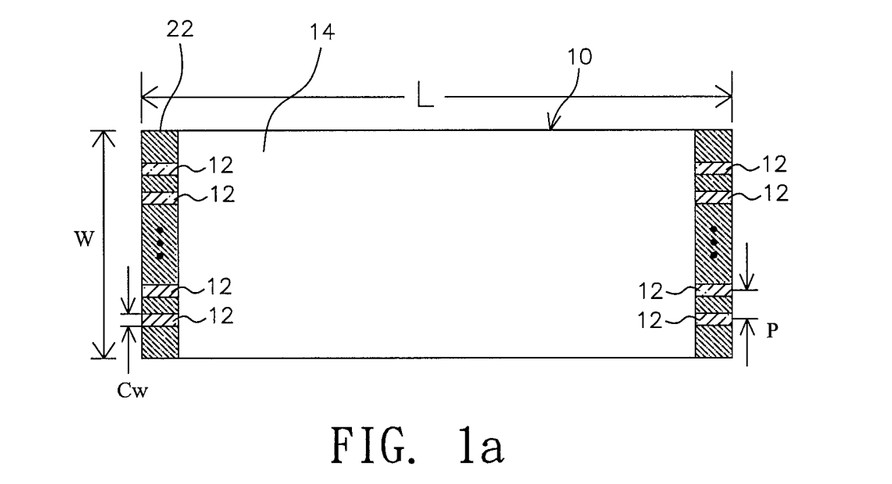
FIG. 1a is a bottom view of this disclosure.
Figure 1B:
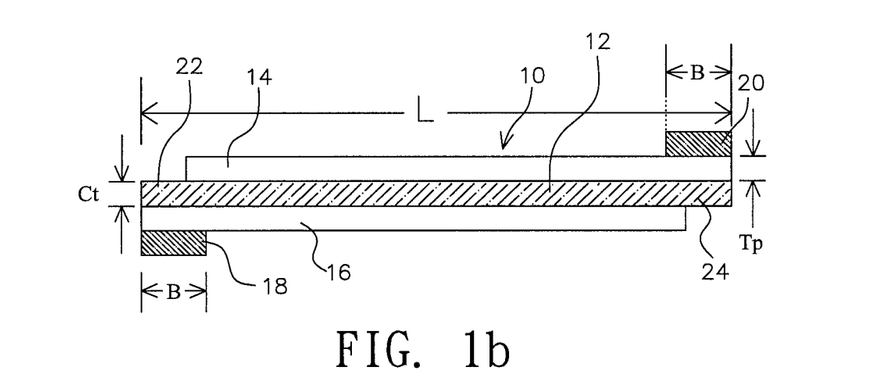
FIG. 1b is a side view of this disclosure.

With reference to FIGS. 1a and 1b for a bottom view and a side view of a flexible flat cable structure capable of improving crosstalk interference of this disclosure respectively, these figures are schematic figures provided for the purpose of illustrating the basic structure of this disclosure only, but not intended for limiting the shape, the structure, or the design of the disclosure. In FIGS. 1a and 1b, the flexible flat cable 10 (FFC/Flex Flat Cable) comprises a plurality of telecommunication signal conductors 12 and a support member 14 and a support member 16 installed on both sides of the telecommunication signal conductor 12 respectively, and the telecommunication signal conductors 12 are arranged separately with respect to each other, and the support members 14, 16 are made of polyester, and an edge of the support member 14 and the support member 16 away from the surface of the telecommunication signal conductor 12 has a distal support band 18, and a distal support band 20, wherein the distal support band 18 and the distal support band 20 are arranged at top and bottom ends respectively and configured to be opposite to each other. In other words, the support member 14 and the support member 16 do not cover the telecommunication signal conductor 12 in the longitudinal direction, and a surface of an end of the telecommunication signal conductor 12 (opposite to the distal support band 18 and the distal support band 20) has a bare end 22 and a bare end 24, and the bare end 22 and the bare end 24 allow both ends of the flexible flat cable 10 (FFC) to be exposed from the telecommunication signal conductor 12 and provided for the connection of telecommunication signals when the flexible flat cable 10 is connected. In the figures, W and L represent the width and length of the flexible flat cable (FFC) 10 respectively, Cw and Ct represent the width and thickness of the telecommunication signal conductor 12 respectively, P represents the pitch between centers of two adjacent telecommunication signal conductors 12, and Tp represents the thickness of the support member 14 and the support member 16 (made of polyester).

Figure 2A:
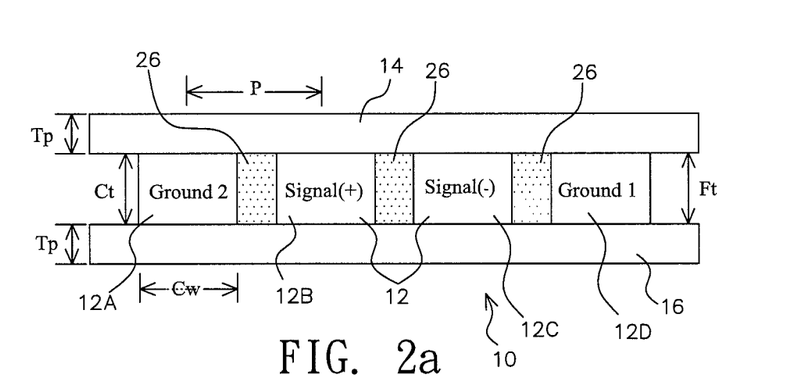
FIG. 2a is a sectional view of a differential pair configuration of a preferred embodiment of this disclosure.

With reference to FIG. 2a for the sectional view showing the configuration of a differential pair of the flexible flat cable (FFC) 10 of this disclosure, the flexible flat cable (FFC) 10 is provided for transmitting a differential signal, and the flexible flat cable (FFC) 10 comprises a plurality of telecommunication signal conductors 12, 12A, 12B, 12C and 12D, wherein the telecommunication signal conductor 12B and the telecommunication signal conductor 12C disposed on an inner side of the flexible flat cable 10 are used as signal lines, and the telecommunication signal conductor 12A and the telecommunication signal conductor 12D disposed on two outer sides of the telecommunication signal conductor 12B and the telecommunication signal conductor 12C respectively are used as ground lines. In addition, a filler is disposed between the telecommunication signal conductors 12 to form a filled material 26. In the figure, there is a filled material 26 between the telecommunication signal conductor 12A and the telecommunication signal conductor 12B, between the telecommunication signal conductor 12B and the telecommunication signal conductor 12C, and between the telecommunication signal conductor 12C and the telecommunication signal conductor 12D, and Ft represents the thickness of the filled material 26.

Figure 2B:
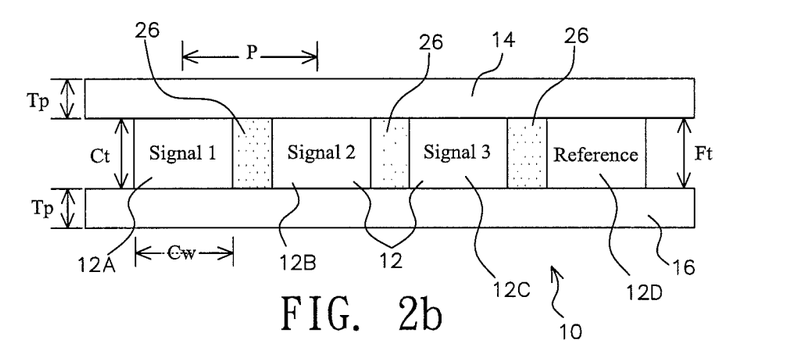
FIG. 2b is a sectional view of FIG. 2a, wherein a ground line substitutes a signal line.

With reference to FIG. 2b for a sectional view of FIG. 2a, a telecommunication signal conductor 12A is substituted by a signal line, and the telecommunication signal conductors 12A, 12B, 12C of the flexible flat cable 10 (FFC) are signal lines, and the telecommunication signal conductor 12D is a reference line, and these lines define an asymmetrical three-line structure. Similarly, a filler is disposed between the telecommunication signal conductors 12 to form the filled material 26.

Figure 3:
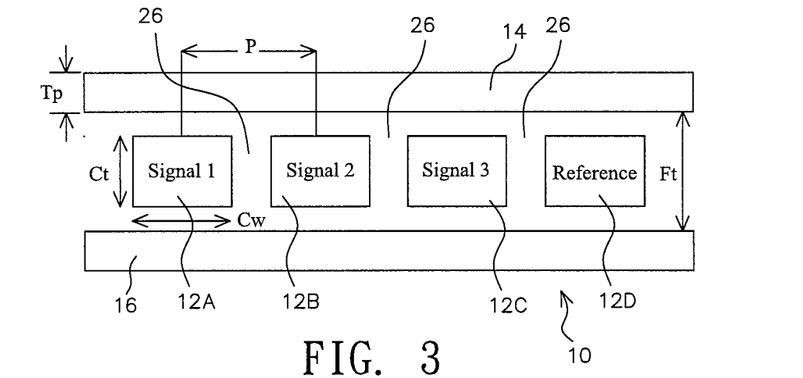
FIG. 3 is a sectional view of a differential pair configuration with a thicker filled material in accordance with a preferred embodiment of this disclosure.

In FIG. 3, the flexible flat cable (FFC) 10 has the telecommunication signal conductors 12 (12A, 12B, 12C and 12D) and the filled material 26 disposed between the support member 14 and the support member 16 on both sides, wherein the filled material 26 has a relatively larger thickness (Ft).

Figure 4A:
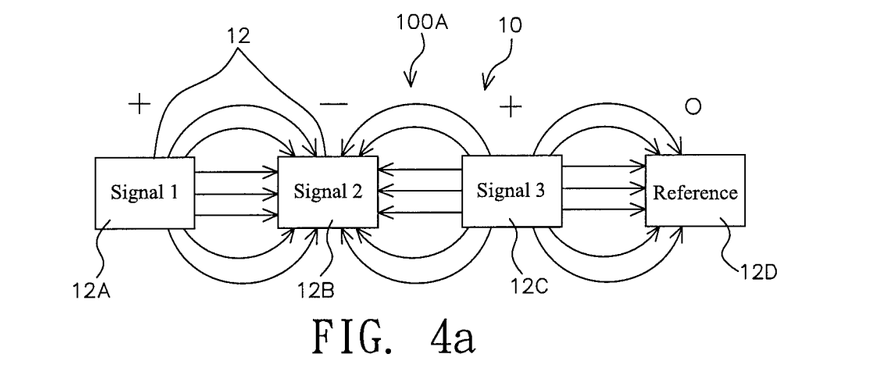
FIGS. 4a~4c are sectional views showing different electric fields of the mode as depicted in FIG. 2b.
Figure 4B:
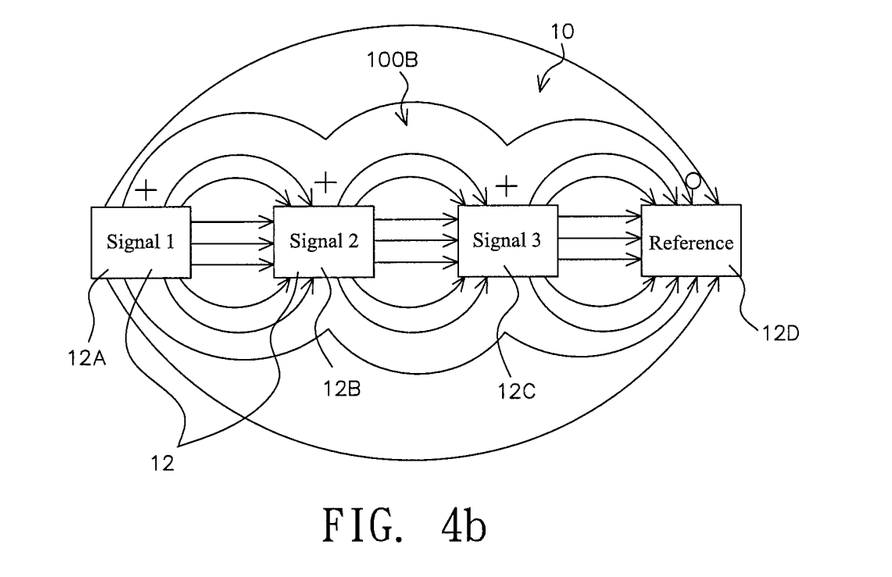
Figure 4C:
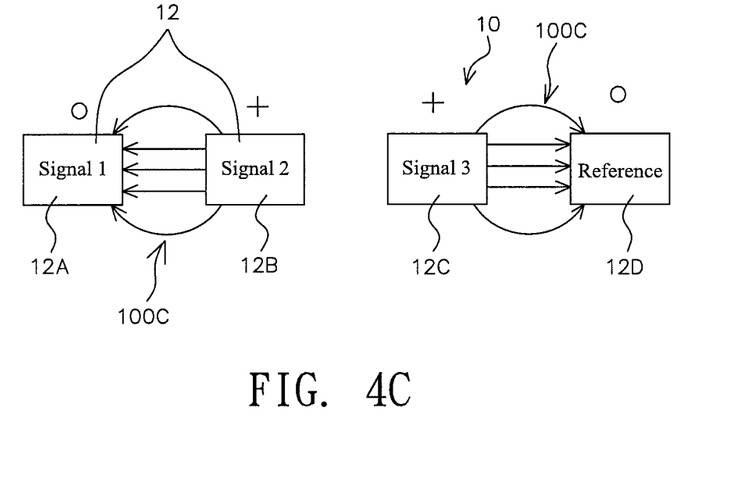

With reference to FIGS. 4a, 4b and 4c for different electric field modes of the flexible flat cable (FFC) 10 as depicted in FIG. 2b, the electric field 100A and the electric field 100B at the middle surface areas as shown in FIGS. 4a and 4b are opposite (anti-symmetric), and thus they can be considered as two differential modes, wherein the electric field mode of the flexible flat cable 10 as shown in FIG. 4a is named as a differential signal mode 1, and the electric field mode of the flexible flat cable 10 as shown in FIG. 4b is named as a differential signal mode 2, and FIG. 4c shows a common mode, wherein the electric field 100C opposite to the middle surface area is symmetrical.

In a high-speed transmission of differential signals, a time delay caused by the transmission via the conductive wire occurs. The smaller the time delay, the smaller the resonance effect. Therefore, the crosstalk interference is reduced. On the other hand, the greater the time delay, the greater the resonance effect. Therefore, the crosstalk interference is increased. This disclosure adjusts the ratio of the equivalent dielectric constant of the filled material of the flexible flat cable to the equivalent dielectric constant of the support plate and the ratio of the thicknesses to minimize the time delay and the resonance effect, so as to reduce the crosstalk interference and improve the signal transmission quality significantly. According to the journal of IEEE Transaction (Volume: 5, Issue: 8) entitled "Ringing Noise Suppression for Differential Signaling in Unshielded Flexible Flat Cable" published by the inventors of this disclosure: HUANG, SHIH-YA, LIU, CHIA-TSUNG, WU, RUEY-BEEI) on August, 2015, the time delay is calculated by multiplying inductance matrix and capacitance matrix according to the following equation:

$$TDn=\sqrt{L_{m,nn}C_{m,nn}}$$

wherein, TDn represents the time delay; Lm,nn represents the inductance matrix; Cm,nn represents the capacitance matrix; m,n represent the components of the matrix, n∈{1, 2}, m∈{1, 2}, and {1, 2} represent the sets of the differential signal mode 1 (as shown in FIG. 4a) and the differential signal mode 2 (as shown in FIG. 4b).

To find the conditions for minimizing the time delay, the discloser of this disclosure simulates the time delay for more than ten thousand times by using the aforementioned equation and compares the equivalent dielectric constants of different filled materials 26, the equivalent dielectric constant of different support members 14, 16, and the thicknesses of different filled materials 26 with the thickness of the support members 14, 16 (polyester/polyester). The results are shown in FIG. 5, wherein each curve of FIG. 5 represents Difference of Time Delay, ns/m, and the x-axis represents the Half Thickness of Filled Material 26 (Ft/2, μm), and the y-axis represents the thickness of polyester (Tp, μm) of the support members 14, 16 (polyester/polyester), and the values shown in the figure are in the unit of ns/m.

Figure 5:
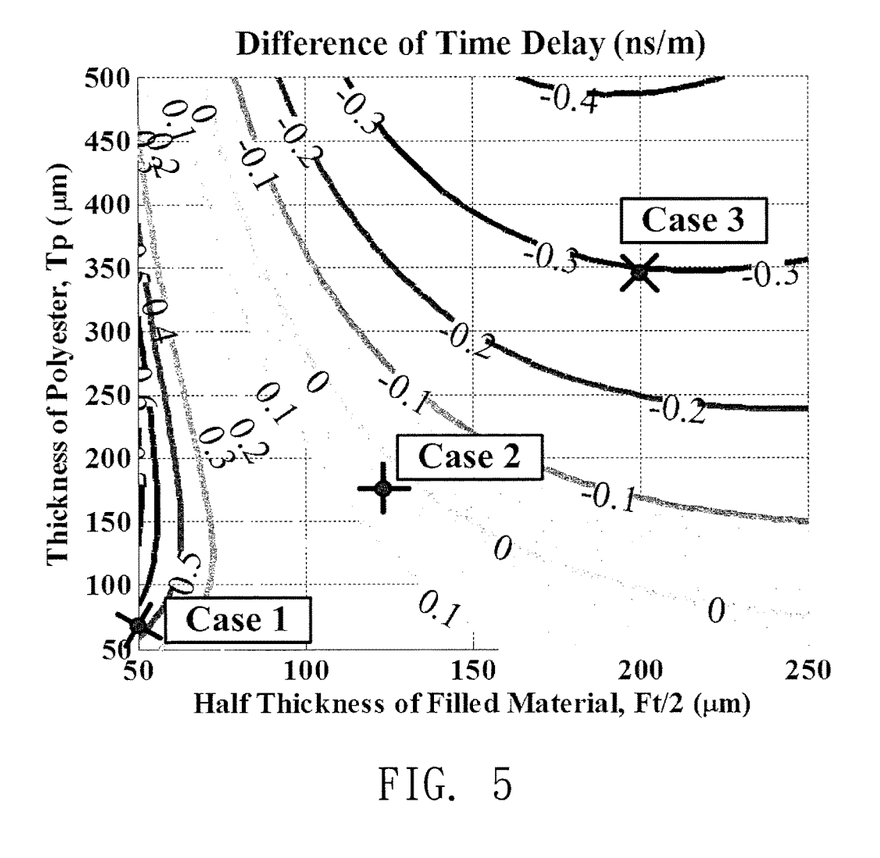
FIG. 5 is a schematic view showing the time delay for different dimensions of this disclosure.

In FIG. 5, the condition of the time delay indicated by the grey portion of the figure preferably falls within a range from −0.1 ns/m to 0.1 ns/m in order to minimize the time delay and the resonance effect. If the thickness of the filled material 26 and the support members 14, 16 gradually increases from a minimal value, the time delay will gradually become smaller. If the thickness of the filled material 26 and the support members 14, 16 further increases, the time delay will become a negative value, and its absolute value will gradually increase.

TABLE 1

Dimensions of FFC Assembly

| Content | Case 1 | Case 2 | Case 3 |
|---|---|---|---|
| Width (Cw) of Telecommunication Signal Conductor | | 300 | |
| Thickness (Ct) of Telecommunication Signal Conductor | | 100 | |
| Pitch (P) between Telecommunication Signal Conductors | | 500 | |
| Length (L) of Telecommunication Signal Conductor | | 243 (mm) | |
| Thickness (Tp) of Support Member | 60 | 175 | 350 |
| Half Thickness (Ft/2) of Filled material | 50 | 125 | 200 |

(Unit: μm)

The flexible flat cable structure capable of improving crosstalk interference in accordance with this disclosure is illustrated by three Cases (Case 1, Case 2 and Case 3) of different dimensions, wherein Case 2 (falling in the middle gray portion of FIG. 5) is a preferred embodiment, and Case 1 (falling in the lower left portion of FIG. 5) and Case 3 (falling in the upper and lower right portions of FIG. 5) are controls, and results and a contour chart are marked in FIG. 5. With reference to Table 1 for the dimensions of the FFC assembly, the telecommunication signal conductor 12 of the flexible flat cable (FFC) 10 has a width (Cw) and a thickness (Ct) equal to 300 μm and 100 μm respectively, and the dielectric constants of the filled material 26 (polyester) and the support member (14, 16) are approximately equal to 3.6 and 1.2 respectively, and the pitch between the telecommunication signal conductors 12 is equal to 500 μm and the length is equal to 243 mm, and the difference dimensions in accordance with the three cases (Case 1, Case 2 and Case 3) include the flexible flat cable (FFC) 10 with a relatively greater thickness (Ft) of the filled material 26 as shown in FIG. 3, or the flexible flat cable (FCC) 10 with the original thickness as shown in FIG. 2. Although the thickness of the filled material 26 varies, the telecommunication signal conductor 12 (including the signal lines 12A, 12B, and 12C) is disposed in the middle area.

In Case 1, the support member (14, 16) has a thickness equal to 60 μm, the filled material 26 (polyester) has a half thickness (Ft/2) equal to 50 μm. As shown in FIG. 5, the time delay is approximately equal to 0.5 ns/m.

Figure 6A:
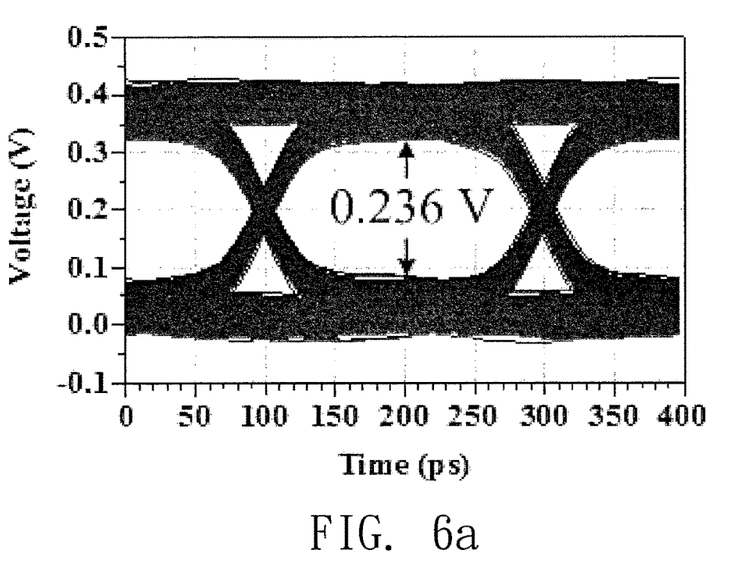
FIGS. 6a~6c are schematic views of eye patterns of Cases 1 to 3 of a preferred embodiment of this disclosure respectively.
Figure 6B:
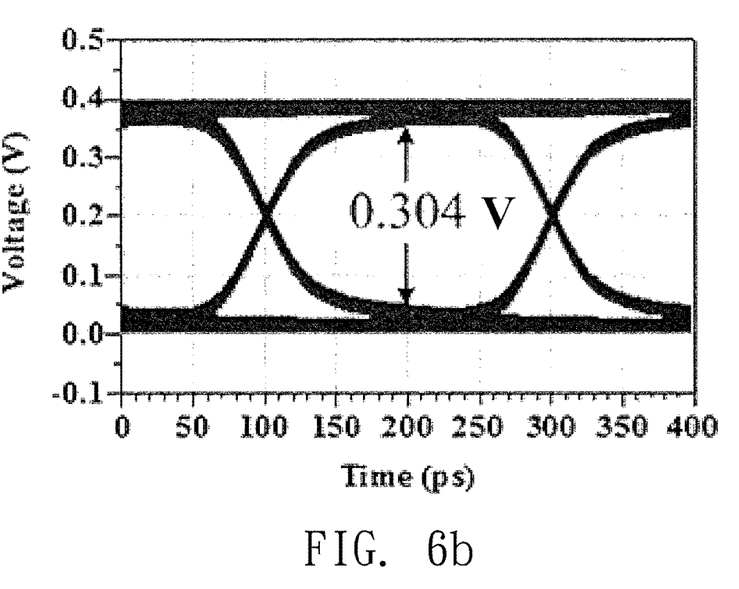
Figure 6C:
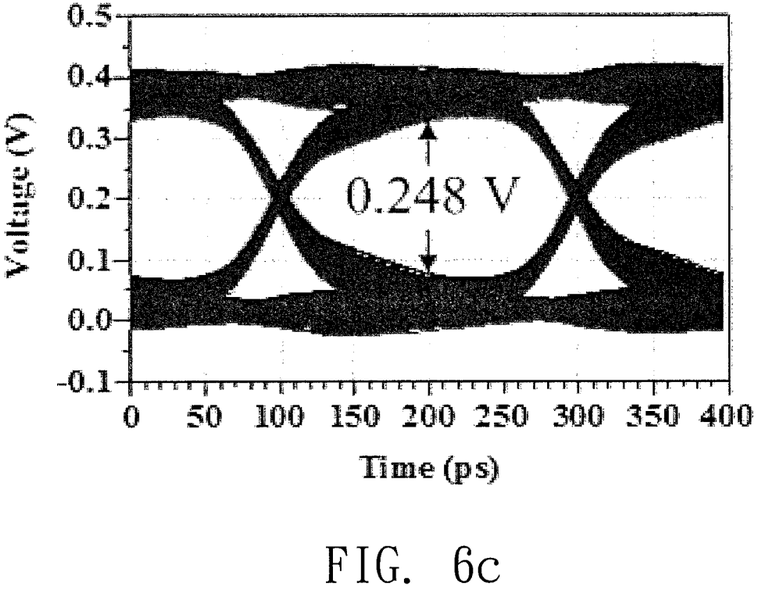

This disclosure uses the simulation software of the Keysight's Advanced Design System (ADS) to simulate the eye patterns of Cases 1, 2, and 3 as shown in FIGS. 6a, 6b, and 6c respectively to evaluate the level of interference and signal distortion in each case. FIG. 6a shows the eye height of the eye pattern in Case 1 eye pattern, wherein the eye height is 0.236V.

In Case 2, the support member (14, 16) has a thickness equal to 175 μm, the filled material 26 (polyester) has a half thickness (Ft/2) equal to 125 μm. In FIG. 5, the time delay is less than 0.1 ns/m, and it is the minimum time delay, and thus Case 2 is the best design among the three cases. Now, the dielectric constants of the filled material 26 (polyester) and the support member (14, 16) are approximately and respectively equal to 3.6 and 1.2. In other words, the ratio of the equivalent dielectric constant of the filled material 26 (polyester) to the equivalent dielectric constant of the support member (14, 16) falls in a range of 0.330.34. The punctuation mark "~" that indicates range (from a number to another number). For example, "12~15" means "12 to 15", so [the ratio of the equivalent dielectric constant of the filled material 26 (polyester) to the equivalent dielectric constant of the support member (14, 16) falls in a range of 0.33~0.34] means that [the ratio of the equivalent dielectric constant of the filled material 26 (polyester) to the equivalent dielectric constant of the support member (14, 16) falls in a range of interval [0.33, 0.34]]. Now, the support member (14, 16) has a thickness equal to 175 μm, the filled material 26 (polyester) has a half thickness (Ft/2) equal to 125 μm, and the ratio of the thickness of the filled material 26 (polyester) to the thickness of the support member (14, 16) falls within a range of 1.43~1.42.

With reference to FIG. 6b for Case 2 of this disclosure, the eye height of the eye pattern is 0.304V, so that the resonance effect is reduced, and the eye height of Case 1 is improved by 28.8%, and thus Case 2 has minimal interference and signal distortion.

In Case 3, the support member (14, 16) has a thickness equal to 350 μm, the filled material 26 (polyester) has a half thickness (Ft/2) equal to 200 μm. As shown in FIG. 5, the difference of time delay is approximately equal to 0.5 ns/m. As shown in FIG. 6c, the eye height of the eye pattern is 0.248V. As the resonance effect becomes greater, the eye height drops 22.5% in Case 2.

In the foregoing analysis, the flexible flat cable structure capable of improving crosstalk interference in accordance with this disclosure is applied to a differential signal transmission line to perform signal transmissions, and the ratio of the equivalent dielectric constant of the filled material of the flexible flat cable to the equivalent dielectric constant of the support plate and the ratio of the thicknesses are adjusted to minimize the time delay and reduce the resonance effect and crosstalk interference. The following conclusion is drawn after the analysis takes place. If the ratio of the equivalent dielectric constant of the filled material 26 (polyester) to the equivalent dielectric constant of the support member (14, 16) falls within a range of 0.34~0.33, and the ratio of the thickness of the filled material 26 (polyester) to the thickness of the support member (14, 16) falls within a range of 1.43~1.42, the time delay will be minimized, and the crosstalk noise and resonance interference will reduced most effectively.

However, the ratio of the equivalent dielectric constant of the filled material 26 (polyester) to the equivalent dielectric constant of the support member (14, 16) may be increased slightly to 0.360.30 to further reduce the crosstalk noise. If the ratio of the equivalent dielectric constant of the filled material 26 (polyester) to the equivalent dielectric constant of the support member (14, 16) is further increased to 0.39~0.27, the crosstalk noise will be reduced even more.

In addition, the ratio of the thickness of the filled material 26 (filled material/polyester) to the thickness of the support member (14, 16) may be slightly increased to 1.46~1.40 to eliminate crosstalk noise with a better effect. If the ratio of the thickness of the filled material 26 (filled material/polyester) to the thickness of the support member (14, 16) is further increased to 1.49~4.37 to eliminate crosstalk noise with a better effect.

In this disclosure, the flexible flat cable structure capable of improving crosstalk interference and adjusting the ratio of the equivalent dielectric constant of the filled material of the flexible flat cable (FFC) to the equivalent dielectric constant of the support plate and the ratio of the thicknesses to avoid the crosstalk problem caused by resonance, so as to achieve the effects of improving the signal transmission quality, reducing the time delay of the signal transmission of the flexible flat cable (FFC), suppressing the ringing noise of resonance, and improving the eye height of amplitude measurement. As a result, the crosstalk interference is suppressed and the signal transmission quality is improved effectively.

While the invention has been described by means of specific embodiments, numerous modifications and variations could be made thereto by those skilled in the art without departing from the scope and spirit of the invention set forth in the claims.

What is claimed is:

1. A flexible flat cable structure capable of improving crosstalk interference, comprising:
   a plurality of telecommunication signal conductors, separately arranged with respect to each other, and provided for transmitting a differential signal;
   two support members, installed on two lateral sides of the plurality of telecommunication signal conductors respectively;
   at least one filled material, disposed between the plurality of telecommunication signal conductors;
   wherein, the ratio of the equivalent dielectric constant of the filled material to the equivalent dielectric constant of each support member falls within a range of 0.39~0.27, and the ratio of the thickness of the filled material to the thickness of each support member falls within a range of 1.49~1.37; and the flexible flat cable structure capable of eliminating crosstalk interference effectively, and
   wherein each support member is made of polyester.

2. The flexible flat cable structure capable of improving crosstalk interference according to claim 1, wherein the ratio of the equivalent dielectric constant of the filled material to the equivalent dielectric constant of each support member falls within a range of 0.36~0.30.

3. The flexible flat cable structure capable of improving crosstalk interference according to claim 2, wherein the ratio of the equivalent dielectric constant of the filled material to the equivalent dielectric constant of each support member falls within a range of 0.34~0.33.

4. The flexible flat cable structure capable of improving crosstalk interference according to claim 1, wherein the ratio of the thickness of the filled material to the thickness of each support member falls within a range of 1.46~1.40.

5. The flexible flat cable structure capable of improving crosstalk interference according to claim 4, wherein the ratio of the thickness of the filled material to the thickness of each support member falls within a range of 1.43~4.42.

6. The flexible flat cable structure capable of improving crosstalk interference according to claim 1, wherein the ratio of the equivalent dielectric constant of the filled material to the equivalent dielectric constant of the support member falls within a range of 0.34~0.33, and the ratio of the thickness of the filled material to the thickness of each support member falls within a range of 1.43~1.42.

* * * * *